United States Patent
Yeon et al.

(10) Patent No.: US 10,797,040 B2
(45) Date of Patent: Oct. 6, 2020

(54) METHOD OF MANUFACTURING DISPLAY MODULE USING LED

(71) Applicant: SAMSUNG ELECTRONICS CO., LTD., Suwon-si (KR)

(72) Inventors: Ji Hye Yeon, Suwon-si (KR); Su Hyun Jo, Hwaseong-si (KR); Sung Hyun Sim, Uiwang-si (KR); Ha Nul Yoo, Bucheon-si (KR); Yong Il Kim, Seoul (KR); Han Kyu Seong, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/798,027

(22) Filed: Feb. 21, 2020

(65) Prior Publication Data

US 2020/0194417 A1  Jun. 18, 2020

Related U.S. Application Data

(63) Continuation of application No. 16/185,602, filed on Nov. 9, 2018, now Pat. No. 10,573,632.

(30) Foreign Application Priority Data

Jun. 1, 2018  (KR) .................. 10-2018-0063673

(51) Int. Cl.
*H01L 29/00* (2006.01)
*H01L 27/12* (2006.01)
(Continued)

(52) U.S. Cl.
CPC .............. *H01L 25/50* (2013.01); *H01L 24/08* (2013.01); *H01L 25/18* (2013.01); *H01L 33/508* (2013.01);
(Continued)

(58) Field of Classification Search
CPC .... H01L 25/50; H01L 33/508; H01L 27/1266
(Continued)

(56) References Cited

U.S. PATENT DOCUMENTS 6,316,278 B1  11/2001  Jacobsen et al.
6,372,608 B1   4/2002  Shimoda et al.
(Continued)

FOREIGN PATENT DOCUMENTS

KR        10-1476207 B1   12/2014
KR    10-2017-0100999 A    9/2017

*Primary Examiner* — Sheikh Maruf
(74) *Attorney, Agent, or Firm* — Sughrue Mion, PLLC

(57) ABSTRACT

A method of manufacturing a display module includes preparing a first substrate structure including an light-emitting diode (LED) array containing a plurality of LED cells, electrode pads connected to the first and second conductivity-type semiconductor layers, and a first bonding layer covering the LED array; preparing a second substrate structure including a plurality of thin-film transistor (TFT) cells disposed on a second substrate, and each having a source region, a drain region and a gate electrode disposed therebetween, the second substrate structure being provided by forming a circuit region, in which connection portions disposed to correspond to the electrode pads are exposed to one surface thereof, and by forming a second bonding layer covering the circuit region, respectively planarizing the first and second bonding layers, and bonding the first and second substrate structures to each other.

20 Claims, 15 Drawing Sheets

(51) Int. Cl.
*H01L 33/50* (2010.01)
*H01L 25/00* (2006.01)
*H01L 23/00* (2006.01)
*H01L 25/18* (2006.01)
*H01L 27/15* (2006.01)

(52) U.S. Cl.
CPC ........ *H01L 27/124* (2013.01); *H01L 27/1266* (2013.01); *H01L 27/156* (2013.01); *H01L 2224/08145* (2013.01); *H01L 2933/0041* (2013.01)

(58) Field of Classification Search
USPC ...................................................... 438/23, 22
See application file for complete search history.

(56) References Cited

U.S. PATENT DOCUMENTS

| | | | |
|---|---|---|---|
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,825,016 B1 | 11/2017 | Kim et al. |
| 9,825,067 B2 | 11/2017 | Rhee |
| 9,859,330 B2 | 1/2018 | Von Malm et al. |
| 2006/0152644 A1* | 7/2006 | Yi ......................... G02F 1/1368 349/42 |
| 2006/0160257 A1 | 7/2006 | Wu et al. |
| 2006/0269786 A1* | 11/2006 | Shin ....................... H01L 29/458 428/690 |
| 2007/0048885 A1 | 3/2007 | Jeon |
| 2007/0153051 A1* | 7/2007 | Lee ....................... G02F 1/1303 347/37 |
| 2007/0241326 A1* | 10/2007 | Kim .................... H01L 51/5275 257/40 |
| 2008/0006827 A1* | 1/2008 | Shim ................... H01L 27/1214 257/72 |
| 2008/0090343 A1* | 4/2008 | Song ................... H01L 27/1288 438/160 |
| 2010/0012943 A1* | 1/2010 | Park ................... H01L 27/1248 257/66 |
| 2010/0059754 A1 | 3/2010 | Lee et al. |
| 2013/0210179 A1 | 8/2013 | Mei et al. |
| 2013/0270711 A1 | 10/2013 | Hebding et al. |
| 2014/0077199 A1* | 3/2014 | Yamazaki ........... H01L 27/3244 257/40 |
| 2014/0084240 A1 | 3/2014 | Hu et al. |
| 2014/0239508 A1 | 8/2014 | Ichikawa et al. |
| 2014/0264400 A1 | 9/2014 | Lipson et al. |
| 2015/0270321 A1* | 9/2015 | Jinbo ..................... H01L 29/24 438/23 |
| 2016/0064364 A1 | 3/2016 | Shin et al. |
| 2016/0079222 A1 | 3/2016 | Sato |
| 2017/0162507 A1* | 6/2017 | Das ......................... H01L 25/50 |
| 2017/0250316 A1 | 8/2017 | Yeon et al. |
| 2017/0287789 A1* | 10/2017 | Bower .................. H01L 25/167 |
| 2017/0309798 A1 | 10/2017 | Bonar et al. |
| 2017/0358562 A1 | 12/2017 | Banna et al. |
| 2018/0040597 A1 | 2/2018 | Budd et al. |

* cited by examiner

II-II'

METHOD OF MANUFACTURING DISPLAY MODULE USING LED

CROSS-REFERENCE TO RELATED APPLICATION

This application is a Continuation of U.S. application Ser. No. 16/185,602, filed Nov. 9, 2018, in the U.S. Patent and Trademark Office, which claims priority from Korean Patent Application No. 10-2018-0063673, filed on Jun. 1, 2018, in the Korean Intellectual Property Office, the disclosure of which are herein incorporated by reference in their entireties.

BACKGROUND

1. Field

Apparatuses and methods consistent with example embodiments relate to a display module manufactured by using a light-emitting diode (LED).

2. Description of Related Art

Semiconductor light-emitting diodes (LEDs) are used as light sources in various electronic products and lighting devices. For example, semiconductor LEDs are widely used as light sources in various display devices such as a TV, a mobile phone, a personal computer (PC), a notebook PC, a personal digital assistant (PDA), and the like.

Display devices according to the related art mainly consist of a display panel configured as a liquid crystal display (LCD) and a backlight unit. However, recent display devices have been developed in a form in which a backlight is not separately required, by using an LED device to implement integrated pixels. Such display devices may be compact, and may also be implemented as high-luminance display devices having excellent light efficiency as compared to existing LCDs. Such display devices may consist of a plurality of display modules each constituting a pixel.

SUMMARY

One or more example embodiments provide a method of manufacturing a display module, in which a display module including a plurality of pixels may be easily manufactured at the wafer level.

According to an aspect of an example embodiment, a method of manufacturing a display module may include preparing a first substrate structure including a light-emitting diode (LED) array and a first bonding layer covering the LED array, where the LED array contains (i) a plurality of LED cells, each LED cell of the plurality of LED cells having a first conductivity-type semiconductor layer, an active layer and a second conductivity-type semiconductor layer on a first substrate, (ii) electrode pads connected to the first conductivity-type semiconductor layer and the second conductivity-type semiconductor layer of the plurality of LED cells, respectively; preparing a second substrate structure including a plurality of thin-film transistor (TFT) cells disposed on a second substrate to correspond to the plurality of LED cells, respectively, and each TFT cell of the plurality of TFT cells having a source region, a drain region and a gate electrode disposed between the source region and the drain region, the second substrate structure being provided by forming a circuit region, in which connection portions, disposed to correspond to the electrode pads respectively, are exposed to at least one surface of the second substrate structure, and by forming a second bonding layer covering the circuit region; respectively planarizing the first bonding layer and the second bonding layer; and bonding the first substrate structure and the second substrate structure to each other, in such a manner that the electrode pads of the first substrate structure and the connection portions of the second substrate structure correspond to each other, respectively.

According to an aspect of an example embodiment, a method of manufacturing a display module may include preparing a first substrate structure including pixels, each pixel of the pixels having a plurality of subpixels and a plurality of LED cells configured to emit light of a substantially same wavelength, the plurality of LED cells being respectively connected to electrode pads exposed to a first surface of the first substrate structure, the first surface being provided with a first bonding layer formed on the first substrate structure while the first bonding layer covers the plurality of LED cells; preparing a second substrate structure, including a plurality of TFT cells disposed to correspond to the plurality of LED cells, respectively, and each TFT cell of the plurality of TFT cells having a source region, a drain region and a gate electrode disposed between the source region and the drain region, the second substrate structure being prepared by forming a circuit region, in which connection portions disposed to correspond to the electrode pads, respectively, are exposed to a second surface of the second substrate structure, the circuit region being provided with a second bonding layer covering the circuit region while being formed on the second surface; planarizing the first surface of the first substrate structure and the second surface of the second substrate structure, respectively; and bonding the first surface of the first substrate structure and the second surface of the second substrate structure to each other, in such a manner that the electrode pads of the first substrate structure and the connection portions of the second substrate structure correspond to each other, respectively.

According to an aspect of an example embodiment, a method of manufacturing a display module may include preparing a first substrate structure by forming a plurality of cell arrays including a first LED cell, a second LED cell and a third LED cell, each of the first LED cell, the second LED cell and the third LED cell containing a first conductivity-type semiconductor layer, an active layer and a second conductivity-type semiconductor layer on a first substrate, by forming electrode pads connected to the first conductivity-type semiconductor layer and the second conductivity-type semiconductor layer of the first LED cell, the second LED cell and the third LED cell, respectively, and by forming a first bonding layer to cover the first LED cell, the second LED cell and the third LED cell; preparing a second substrate structure including a plurality of TFT cells, disposed to correspond to the first LED cell, the second LED cell and the third LED cell, respectively, and each of the plurality of TFT cells including a source region, a drain region and a gate electrode disposed between the source region and the drain region, the second substrate structure including a circuit region having a first surface, on which connection portions are disposed in regions corresponding to the first LED cell, the second LED cell and the third LED cell, respectively; planarizing a second surface to which the electrode pads of the first substrate structure are exposed, and the first surface of the second substrate structure; and bonding the first surface and the second surface to each other, in such a manner that the first LED cell, the second LED cell and the third LED cell of the first substrate structure correspond to the plurality of TFT cells of the second substrate structure, respectively.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Reference will now be made in detail to various example embodiments with reference to the accompanying drawings. Throughout the specification, it will be understood that when an element, such as a layer, region, or wafer (substrate), is referred to as being "on," "connected to," or "coupled to" another element, it can be directly "on," "connected to," or "coupled to" the other element or other elements intervening therebetween may be present (e.g., electrically connected via an intervening conductor). In contrast, when an element is referred to as being "directly on," "directly connected to," or "directly coupled to" another element, there may be no elements or layers intervening therebetween. Like numerals may refer to like elements throughout. As used herein, the term "and/or" includes any and all combinations of one or more of the associated listed items.

Figure 1:
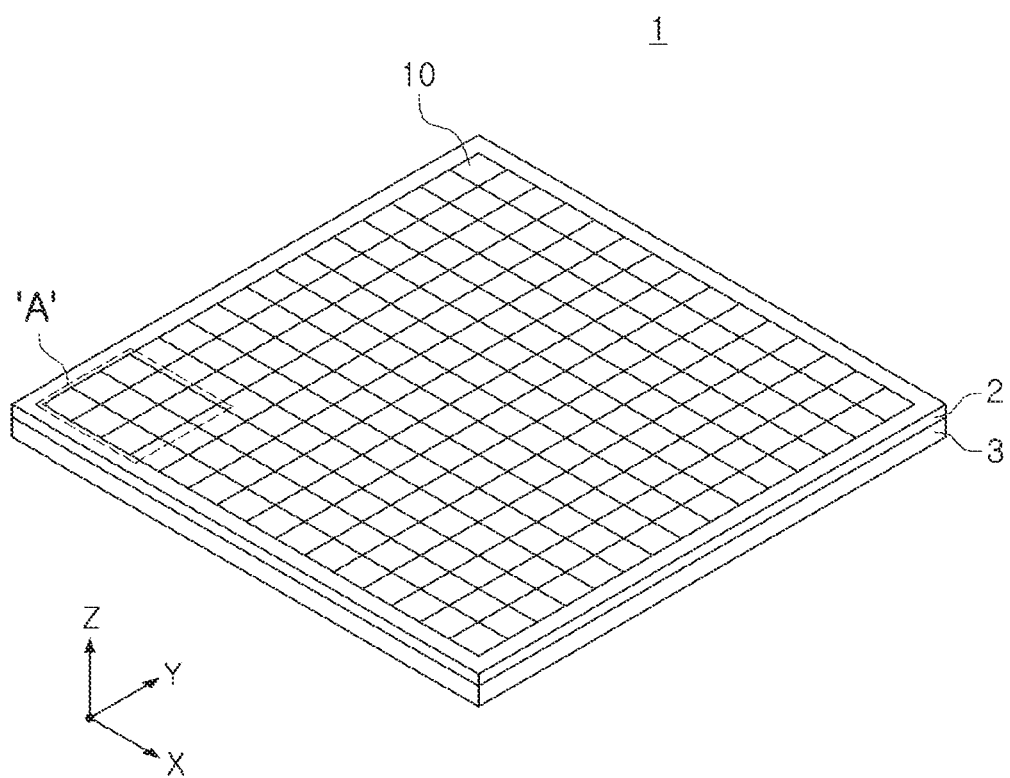
FIG. 1 is a schematic perspective view of a display device including a display module according to an example embodiment.
Figure 2:
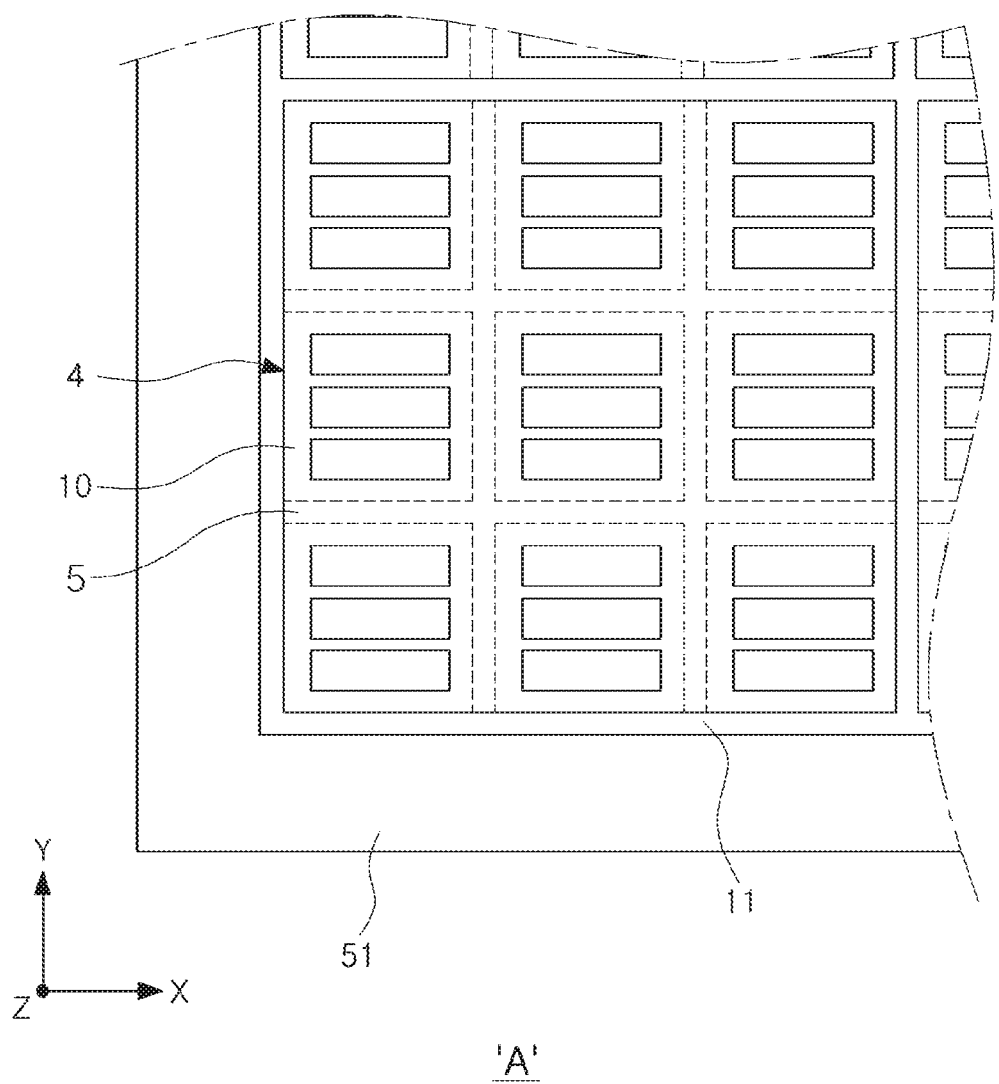
FIG. 2 is an enlarged plan view of portion A of FIG. 1.

FIG. 1 is a schematic perspective view of a display device including a display module according to an example embodiment. FIG. 2 is an enlarged plan view of portion A of FIG. 1, FIG. 3 is an enlarged plan view of one pixel of FIG. 2.

Referring to FIG. 1, a display device 1 may include a circuit board 3 and a display panel 2 including a plurality of pixels 10 arranged on the circuit board 3.

Figure 3:
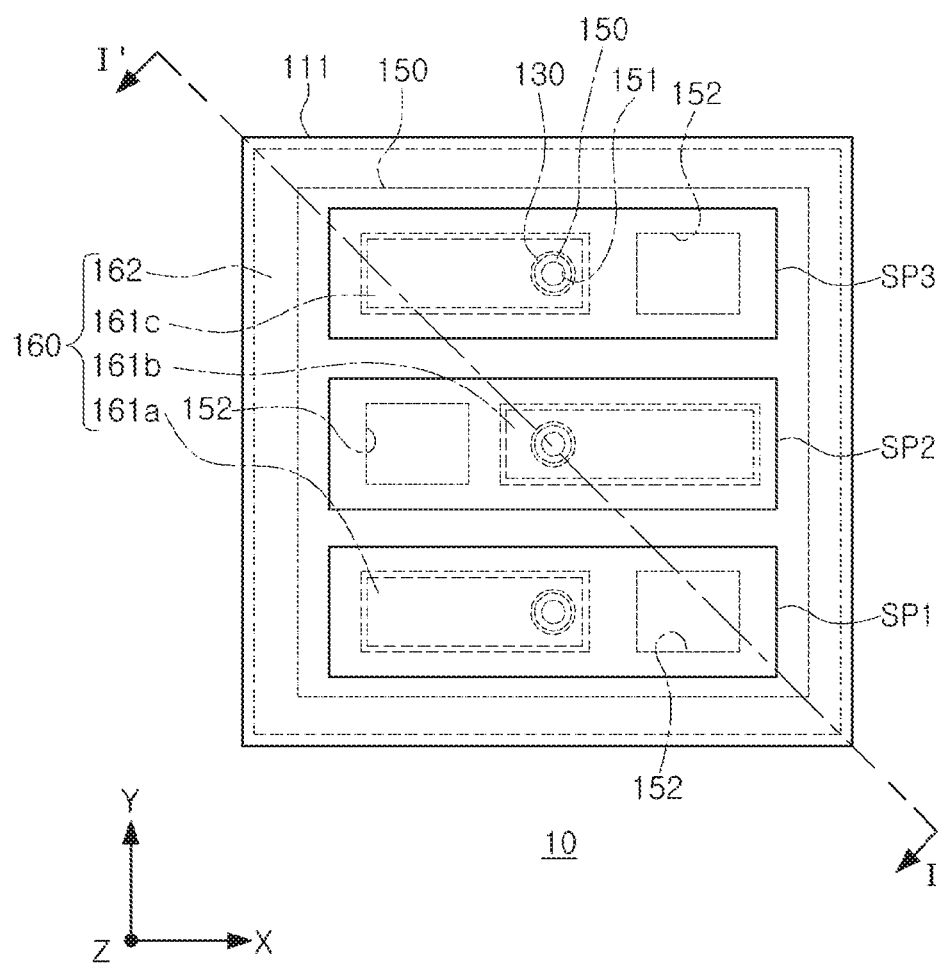
FIG. 3 is an enlarged plan view of one pixel of FIG. 2.

Referring to FIGS. 1 to 3, the display device 1 may include a display module 4 including a plurality of pixels 10, each of which has first to third subpixels SP1, SP2 and SP3 configured to emit light of different colors.

An array of pixels 10 according to the example embodiment is illustrated as being 15×15, but the columns and rows thereof may be implemented in any suitable number, for example, 1,024×768. For example, an array of various types of pixels may be provided depending on a required resolution.

The display device 1 may be configured to provide different colors to the first to third subpixels SP1, SP2 and SP3 to display a color image. For example, the first to third subpixels SP1, SP2 and SP3 may be provided as red, green and blue subpixels, respectively.

The display device 1 may have a rectangular shape as illustrated in FIG. 1, or other suitable shape. The display device 1 may be planar and, in a specific embodiment, a flexible substrate may be employed as a support substrate to provide a curved profile.

As illustrated in FIG. 2, the display device 1 may include the display module 4 having the plurality of pixels 10. Although the display module 4 according to the example embodiment is illustrated as having 3×3 pixels 10, the number of pixels 10 included in a single display module 4 may be an appropriate number, and according to an example embodiment, the display device 1 may only include one display module 4 having a plurality of pixels. Since the one display module 4 includes a plurality of pixels 10, the display device 1 may be configured by being transferred by the unit of a module in a process of manufacturing the display device 1. Thus, the time required for manufacturing the display device 1 may be significantly reduced, as compared with the case in which the display device 1 is configured by being transferred by the unit of a pixel. Reference numeral 5 denotes a portion which is removed when the display module 4 is cut into the unit of the pixel 10.

The display panel 2 may further include a first molding part 11 disposed in a portion thereof to surround a side of the display module 4, as required. The first molding part 11 may include a black matrix. For example, the black matrix may be disposed on a circumferential region of the display panel 2 to serve as a guide line defining a region in which the pixel 10 is disposed. The black matrix is not limited to being black. For example, the black matrix may be provided as a white matrix or in other colors, such as green and the like, depending on the use of a product and the place of use thereof. A transparent matrix may also be used as required. The white matrix may further include a reflective material or a light scattering material. The black matrix may include at least one of materials such as a polymer including a resin, a ceramic, a semiconductor or a metal. Further, a second molding part 51 may be disposed to surround the sides of the first molding part 11.

Figure 4:
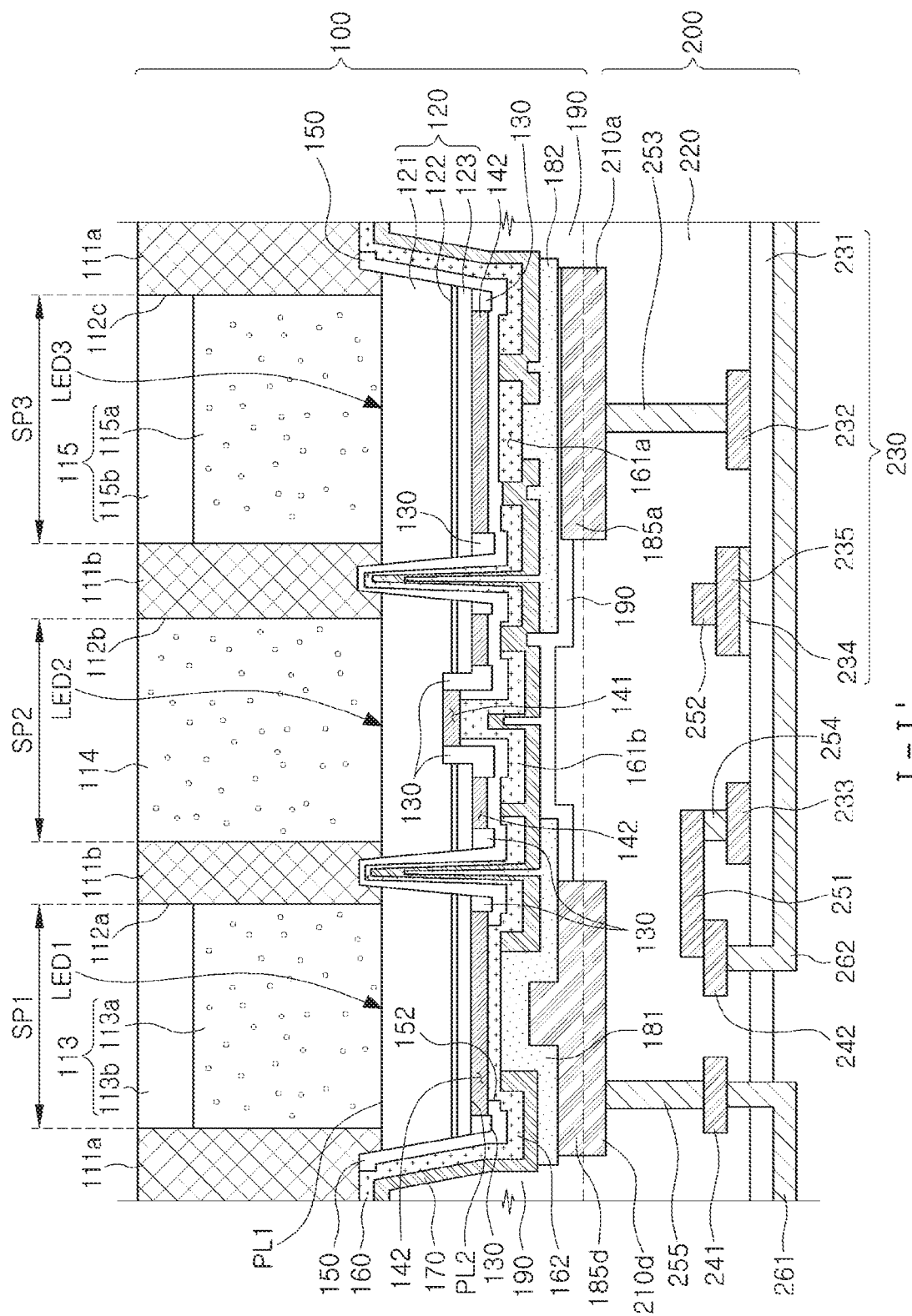
FIG. 4 is a cross-sectional view taken along line I-I' of FIG. 3.

FIG. 3 illustrates one pixel 10, and FIG. 4 illustrates a cross-sectional structure of one pixel 10. First to third light-emitting diode (LED) cells LED1, LED2 and LED3 in FIG. 4 may be understood as LED cells corresponding to first to third subpixels SP1, SP2 and SP3, respectively.

Referring to FIGS. 3 and 4, one pixel 10 may include a first substrate structure 100 and a second substrate structure 200 stacked in a vertical direction (i.e., along the Z-axis). The first substrate structure 100 and the second substrate structure 200 may be internally bonded to each other by a wafer bonding method such as fusion bonding, at the wafer level.

The first substrate structure 100 may include an LED array CA including the first to third LED cells LED1, LED2 and LED3, electrode pads 185a and 185d respectively connected to the first to third LED cells LED1, LED2 and LED3, an insulating layer 150 covering the first to third LED cells LED1, LED2 and LED3, a metal support layer 160 supporting the first to third LED cells LED1, LED2 and LED3, first to third wavelength converters 113, 114 and 115 disposed on the LED array CA, and a partition structure 111 disposed in such a manner that the first to third wavelength converters 113, 114 and 115 are separated from each other. The electrode pads 185a and 185d may be formed of a conductive material such as a metal.

A first bonding layer 190 may be disposed to cover sides of the LED array CA and the electrode pads 185a and 185d. The first bonding layer 190 may be formed of an insulating material, and may include, for example, at least one of SiO, SiN, SiCN, SiOC, SiON and SiOCN. The first bonding layer 190 may be formed of the same material as that of a second bonding layer 220 to be described later. The electrode pads 185a and 185d may be formed of a conductive material such as a metal, and may be formed of the same material as a material of connection portions 210a and 210d. Thus, the first bonding layer 190 may be integrally bonded to a second bonding layer 220 of the second substrate structure 200, and the electrode pads 185a and 185d may be integrally bonded to the connection portions 210a and 210d of the second substrate structure 200. An insulating mask layer 130 may be disposed on a second surface PL2 of the cell array CA, to define a region in which first and second electrodes 141 and 142 of the first to third LED cells LED1, LED2 and LED3 are respectively disposed.

The metal support layer 160 may include a plurality of first regions 161a, 161b and 161c connected to the first electrode 141 through a first opening 151 of the insulating layer 150, and a second region 162 commonly connected to a plurality of the second electrodes 142 through a second opening 152 of the insulating layer 150. In the example embodiment, the second region 162 may be disposed to surround the plurality of first regions 161a, 161b and 161c, and the plurality of first regions 161a, 161b and 161c may have substantially the same area (i.e., area size). An interlayer insulating layer 170 may be disposed on the metal support layer 160 to define a region in which the metal support layer 160 is in contact with pad portions 181 and 182 described later. The interlayer insulating layer 170 may be formed of the same material as that of the insulating layer 150, but is not limited thereto. The pad portions 181 and 182 may be disposed on the interlayer insulating layer 170. The electrode pads 185a and 185d may be disposed on the pad portions 181 and 182, respectively.

The first to third LED cells LED1, LED2 and LED3 may each include epitaxial layers 120, including first and second conductivity-type semiconductor layers 121 and 123 and an active layer 122 interposed therebetween, and may each have a first surface PL1 and a second surface PL2 on opposite sides of each other. The first to third LED cells LED1, LED2 and LED3 may be micro-sized LEDs. The first to third LED cells LED1, LED2 and LED3 are respectively provided as subpixels constituting one pixel. For example, a length of one side of each of the first to third LED cells LED1, LED2 and LED3 may be 10 μm or less.

The epitaxial layers 120 may be grown on a single wafer by the same process, and the epitaxial layers 120 grown in the same process may be separated from each other, thereby being provided as the first to third LED cells LED1, LED2 and LED3.

The active layers 122 of the first to third LED cells LED1, LED2 and LED3 may be configured to emit light of substantially the same color. For example, the active layer 122 may emit blue light of, for example, 440 nm to 460 nm, or ultraviolet or near-ultraviolet light of, for example, 380 nm to 440 nm.

The second substrate structure 200 may include a plurality of thin-film transistor (TFT) cells 230 controlling the LED array CA of the first substrate structure 200, connection portions 210a and 210d connected to the LED array CA, a circuit region including wiring circuits 241, 242, 243 and 244 and vias 253, 254 and 255, and a second bonding layer 220 covering the circuit region. The second bonding layer 220 may be formed of an insulating material, and may include, for example, at least one of SiO, SiN, SiCN, SiOC, SiON and SiOCN. In addition, the second bonding layer 220 may be formed of the same material as a material of the first bonding layer 190.

The TFT cells 230 may be connected to correspond to the first to third LED cells LED1, LED2 and LED3, respectively. Although only one TFT cell 230 is illustrated as being connected to the third LED cell LED3 in FIG. 4, the TFT cells connected to the first and second LED cells LED1 and LED2, respectively, may be understood to be included in other regions of the second substrate structure 200.

The plurality of TFT cells 230 may include a semiconductor layer 231 formed by implanting a P-type impurity into a semiconductor substrate. The semiconductor layer 231 may be provided as a channel region of the TFT cell 230. For example, the semiconductor layer 231 constituting the plurality of TFT cells 230 may include polysilicon and silicon-based semiconductors, a semiconductor oxide such as indium gallium zinc oxide, or a compound semiconductor such as silicon germanium.

The plurality of TFT cells 230 may include a source electrode 232 and a drain electrode 233 disposed in first and second regions, for example, source and drain regions, of the semiconductor layer 231, and a gate insulating film 234 and a gate electrode 235 sequentially disposed between the first and second regions, together with the semiconductor layer 231 providing a channel region.

The plurality of TFT cells 230 may constitute a TFT circuitry, controlling driving of a pixel, in detail, a subpixel. In detail, in the case of the respective first to third subpixels SP1, SP2 and SP3, the drain electrode 233 of each of the plurality of TFT cells 230 may be connected to a second electrode pattern 262 by a via 254 and a connection wiring 251. The second electrode pattern 262 may be connected to a data line, to connect the drain electrode 233 to the data line. The source electrode 232 may be connected to the connection portion 210a through the via 253, and may be electrically connected to the second electrode 142 of the first to third LED cells LED1, LED2 and LED3 through the electrode pad 185a. The gate electrodes 235 of the plurality of TFT cells 230 may be connected to each other by a gate line. The configuration and operations of the circuits will be described below with reference to FIG. 5.

Figure 5:
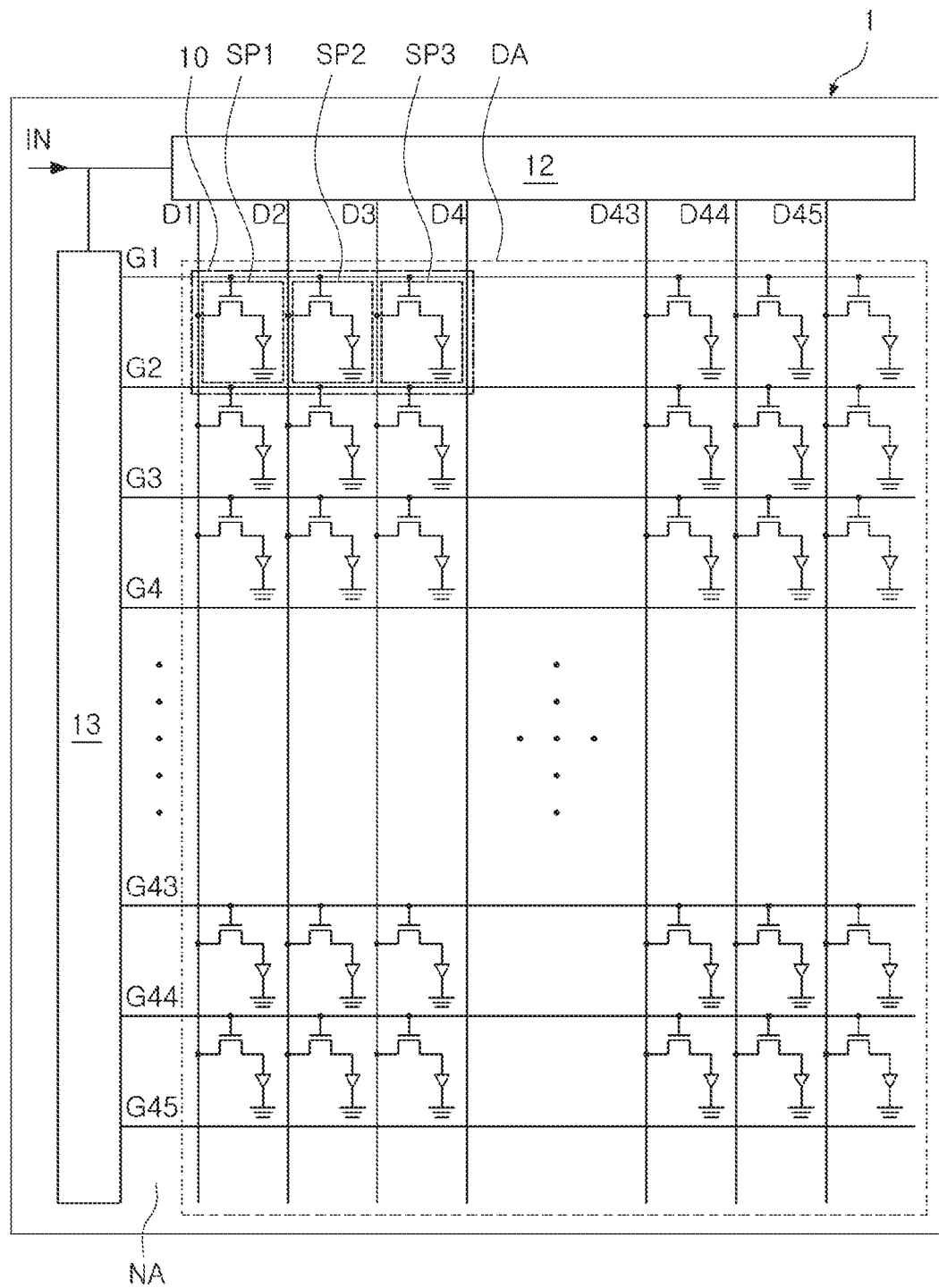
FIG. 5 is a drawing of a driving circuit implemented in the display device of FIG. 1.

FIG. 5 is a driving circuit diagram implemented in a display device illustrated in FIG. 1.

Referring to FIG. 5, a circuit diagram of a display device 1 in which 45×45 subpixels are arranged is illustrated.

The respective subpixels SP1, SP2 and SP3 may receive data signals through paths in a vertical direction, for example, a column direction, via, for example, data lines D1 to D45. The respective subpixels SP1, SP2 and SP3 may receive control signals, for example, gate signals, in a horizontal direction, for example, a row direction, via paths, for example, gate lines G1 to G45.

The respective subpixels SP1, SP2 and SP3 may be arranged in a rectangular array or other forms. An array of a plurality of pixels 10, each including first to third subpixels SP1, SP2 and SP3, may form an active region DA for display, and may be used for a display of an image for a user. An inactive region NA of the display device 1 may be formed along one or more edges of the active region DA. The inactive region NA may form a boundary for the display device 1, in which the pixel 10 is not present. The inactive region NA may be disposed in the second molding part 51 of the display panel 2 described above.

Driver circuits 12 and 13 may be employed to control operations of the pixel 10, for example, the plurality of subpixels SP1, SP2 and SP3. The driver circuits 12 and 13 may be formed as an integrated circuit, a thin-film transistor panel circuit, or other suitable circuit, and may be disposed in the inactive region NA of the display device 1. The driver circuits 12 and 13 may include a microprocessor, a memory such as a storage, a processing circuit, and a communications circuit. During operation, a system control circuit may supply information IN from an image to be displayed on the display device 1, to the driver circuits 12 and 13.

A first driver circuit 12 may transmit control signals different from a clock signal to a second driver 13, which may also be referred to as a gate driver circuit, while supplying image data to the data lines D1 to D45, to display an image on the pixel 10.

The second driver circuit 13 may be implemented using an integrated circuit and/or a thin-film transistor circuit. A gate signal may be transmitted to control the subpixels SP1, SP2 and SP3 arranged in a column direction through the gate lines G1 to G45 of the display device 1.

Each of the subpixels SP1, SP2 and SP3 may include a TFT cell 230 that may also be referred to as a driving transistor and that is connected to each of the LED cells LED1, LED2 and LED3 in series, but an example embodiment thereof is not limited to the circuit configuration of each of the subpixels SP1, SP2, and SP3. For example, the subpixels SP1, SP2 and SP3 may each further include other elements, such that the subpixels may be implemented as various circuits. In detail, each of the subpixels SP1, SP2 and SP3 may further include a capacitor used to store loaded data between successive image frames, or one or more switching transistors to support operations different from data loading operations.

First and second electrode patterns 261 and 262 may be disposed below the second substrate structure 200, to pass through the semiconductor layer 231, providing the channel region, to be connected to the wiring circuits 241 and 242.

The partition structure 111 may be disposed to be in contact with the first surface PL1 of the LED array CA, and may include first to third light-emitting windows 112a, 112b and 112c in positions corresponding to the positions of the first to third LED cells LED1, LED2 and LED3. The first to third light-emitting windows 112a, 112b and 112c may be provided as spaces in which the first to third wavelength converters 113, 114 and 115 are to be formed, respectively. Thus, the first to third LED cells LED1, LED2 and LED 3 may be exposed through the first to third light-emitting windows 112a, 112b and 112c, respectively. The partition structure 111 may be formed by etching a wafer used as a growth substrate on which the first to third LED cells LED1, LED2 and LED3 are to be grown. The partition structure 111 may be disposed to surround side surfaces of the first to third wavelength converters 113, 114 and 115 to separate the first to third wavelength converters 113, 114 and 115 from each other.

The first to third wavelength converters 113, 114 and 115 may adjust and convert light emitted by the first to third LED cells LED1, LED2 and LED3 to light of colors different from each other. In the example embodiment, the first to third wavelength converters 113, 114 and 115 may be configured to provide red light, blue light, and green light, respectively.

As in the example embodiment, in a case in which the first to third LED cells LED1, LED2 and LED3 emit blue light, the first and third wavelength converters 113 and 115 may include phosphor layers 113a and 115b including red and green phosphors, respectively. The first and third wavelength converters 113 and 115 may be formed by dispensing a light-transmissive liquid resin mixed with a wavelength converting material such as a red or green phosphor to the first and third light-emitting windows 112a and 112c, but may also be formed by various other processes. For example, the first and third wavelength converters 113 and 115 may be provided as wavelength conversion films.

The first and third wavelength converters 113 and 115 may further include optical filter layers 113b and 115b to selectively block blue light, as required. By using the optical filter layers 113b and 115b, only the required red light and green light may be provided by the second and third light-emitting windows 112a and 112c.

As in the example embodiment, in the case in which the first to third LED cells LED1, LED2 and LED3 emit blue light, the second wavelength converter 114 may not include a phosphor. Thus, the second wavelength converter 114 may provide the same blue light as the blue light emitted by the first LED cell LED1.

The second wavelength converter 114 may be formed by dispensing a light-transmissive liquid resin in which a phosphor is not mixed, but according to an example embodiment, the second wavelength converter 114 may include a blue or cyan (for example, in the frequency range of 480 nm to 520 nm) phosphor to adjust color coordinates of blue light. Since the phosphor is employed to adjust the color coordinates of blue light to be provided by the second wavelength converter 114, the phosphor thereof may be mixed in an amount less than an amount of a phosphor mixed with the first and third wavelength converters 113 and 115 for conversion into another color.

Next, a method of manufacturing a display module according to an example embodiment will be described. FIGS. 6 to 15 are cross-sectional views illustrating processes of a method of manufacturing a display module according to an example embodiment.

Figure 6:
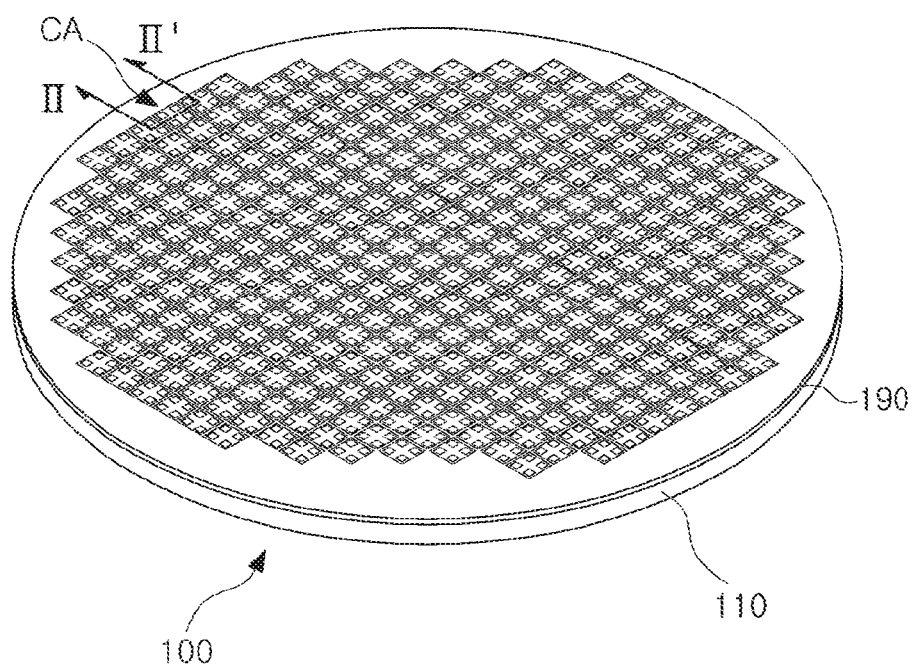
FIGS. 6 to 15 are cross-sectional views illustrating a method of manufacturing a display module according to an example embodiment.
Figure 7:
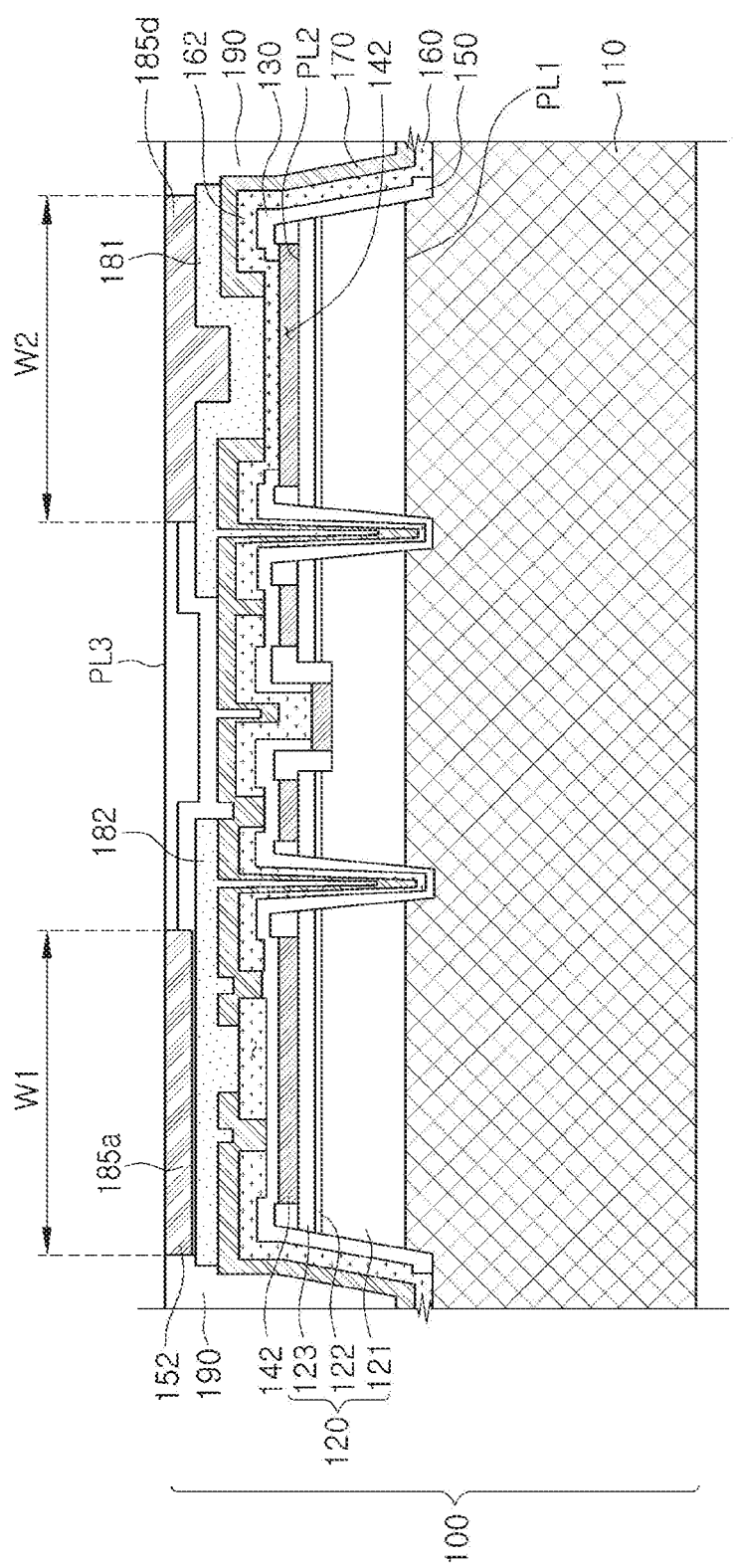

First, as illustrated in FIGS. 6 and 7, first to third LED cells LED1, LED2 and LED3, including a first conductivity-type semiconductor layer 121, an active layer 122 and a second conductivity-type semiconductor layer 123, an insulating layer 150 respectively surrounding the first to third LED cells LED1, LED2 and LED3, a metal support layer 160 supporting the first to third LED cells LED1, LED2 and LED3, an interlayer insulating layer 170, pad portions 181 and 182d, and an LED array CA may be prepared on a first substrate 110 as a growth substrate. In an example embodiment, a case in which the first substrate 110 is a Si wafer will be described below by way of example. In this case, the electrode pads 185a and 185d may be formed to be connected to the pad portions 181 and 182, and a first bonding layer 190 may be formed to cover the first to third LED cells LED1, LED2 and LED3. Planarization of a surface may further be performed, such that the electrode pads 185a and 185d and the first bonding layer 190 may have a coplanar surface PL3. The electrode pads 185a and 185d may be formed to have the same sizes W1 and W2 as the connection portions 210a and 210d to be bonded in a subsequent process. Reference numerals of the same configurations as those shown in the display module of FIG. 4 denote the same configurations, and thus, a detailed description thereof will be omitted.

Figure 8:
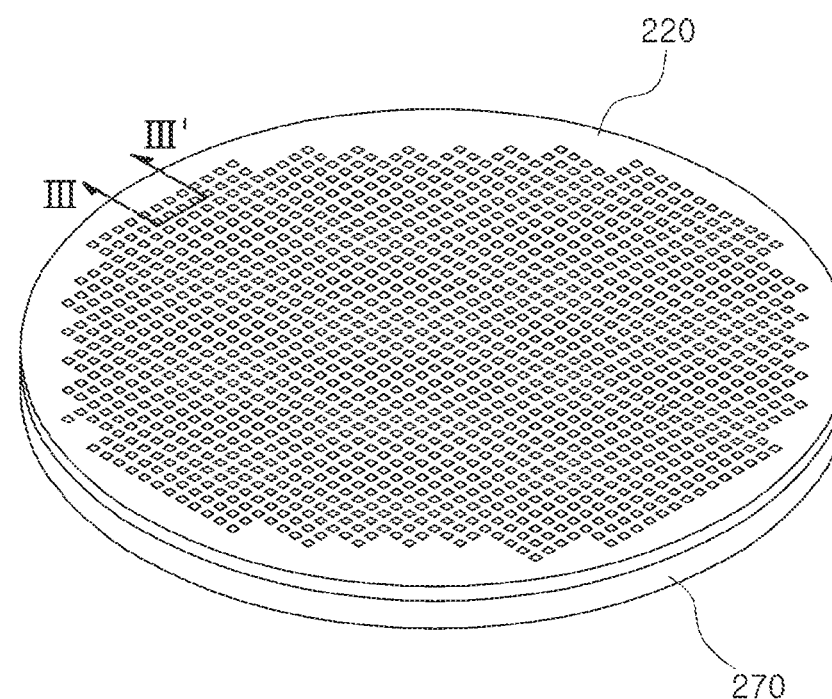
Figure 9:
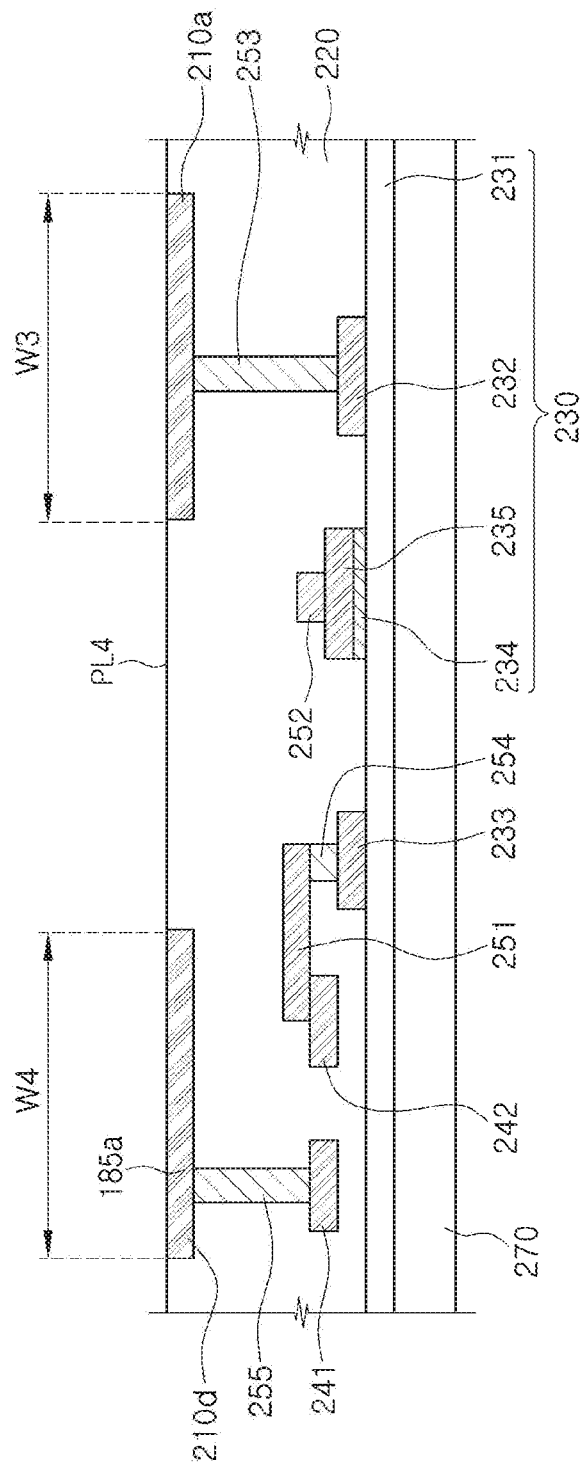

In addition, as illustrated in FIGS. 8 and 9, a semiconductor layer 231, providing a channel region, may be formed by implanting a P-type impurity on a second substrate 270, and a plurality of TFT cells 230, connection portions 210a and 210d to be connected to an LED array CA, a circuit region including wiring circuits 241, 242, 243 and 244 and vias 253, 254 and 255, and a second bonding layer 220 covering the circuit region may be formed, thereby preparing a second substrate structure 200. In this case, an operation of planarizing surfaces of the connection portions 210a and 210d and the second bonding layer 220 may be performed to have a coplanar surface PL4. The connection portions 210a and 210d may be arranged in a matrix on the second bonding layer 220.

Figure 10:
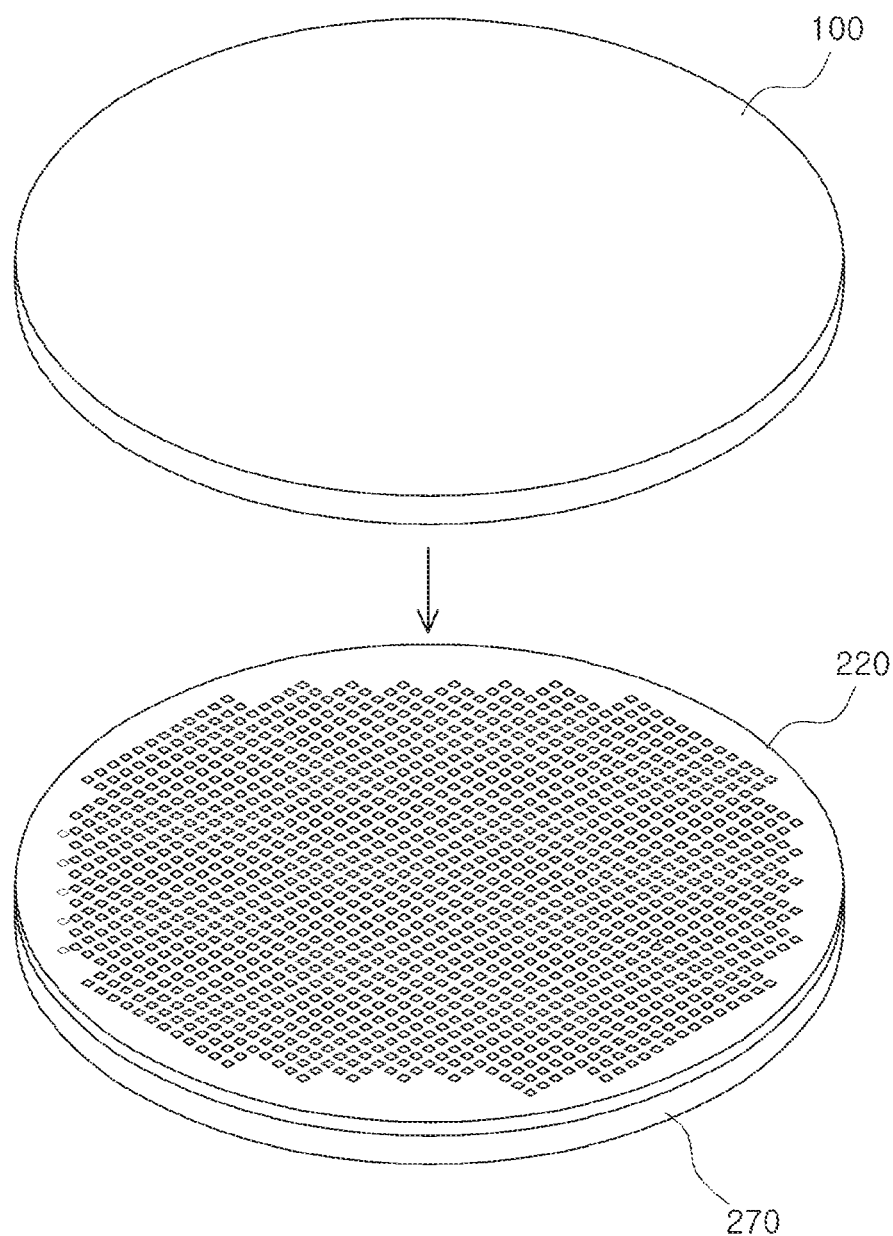

Next, as illustrated in FIG. 10, a first substrate structure 100 and a second substrate structure 200 may be bonded to each other. Such bonding may be performed using a wafer bonding process such as fusion bonding.

Figure 11:
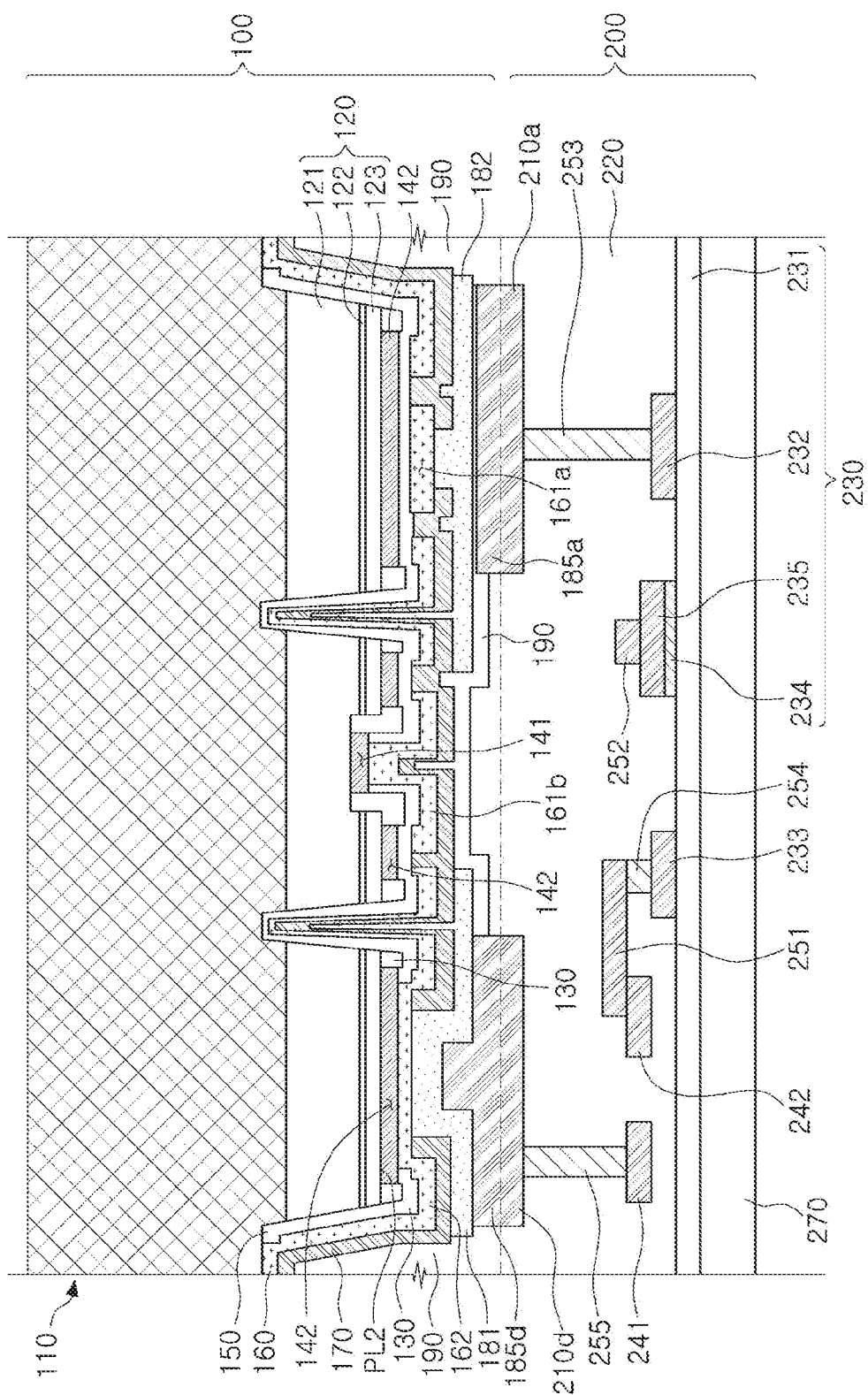

The electrode pads 185a and 185d of the first substrate structure 100 and the connection portions 210a and 210d of the second substrate structure 200 may be aligned to correspond to each other, respectively. Then, the first substrate structure 100 and the second substrate structure 200 may be bonded to each other, through a first operation in which the first bonding layer 190 and the second bonding layer 220 are pressed at room temperature to be bonded to each other, and a second operation in which the electrode pads 185a and 185d and the connection portions 210a and 210d are annealed to be bonded to each other. FIG. 11 illustrates a state in which the first bonding layer 190 and the second bonding layer 220 are bonded to each other such that the first substrate structure 100 and the second substrate structure 200 may be bonded at a wafer level. After the first substrate structure 100 and the second substrate structure 200 are bonded to each other, the second substrate 270 may be grounded.

Figure 12:
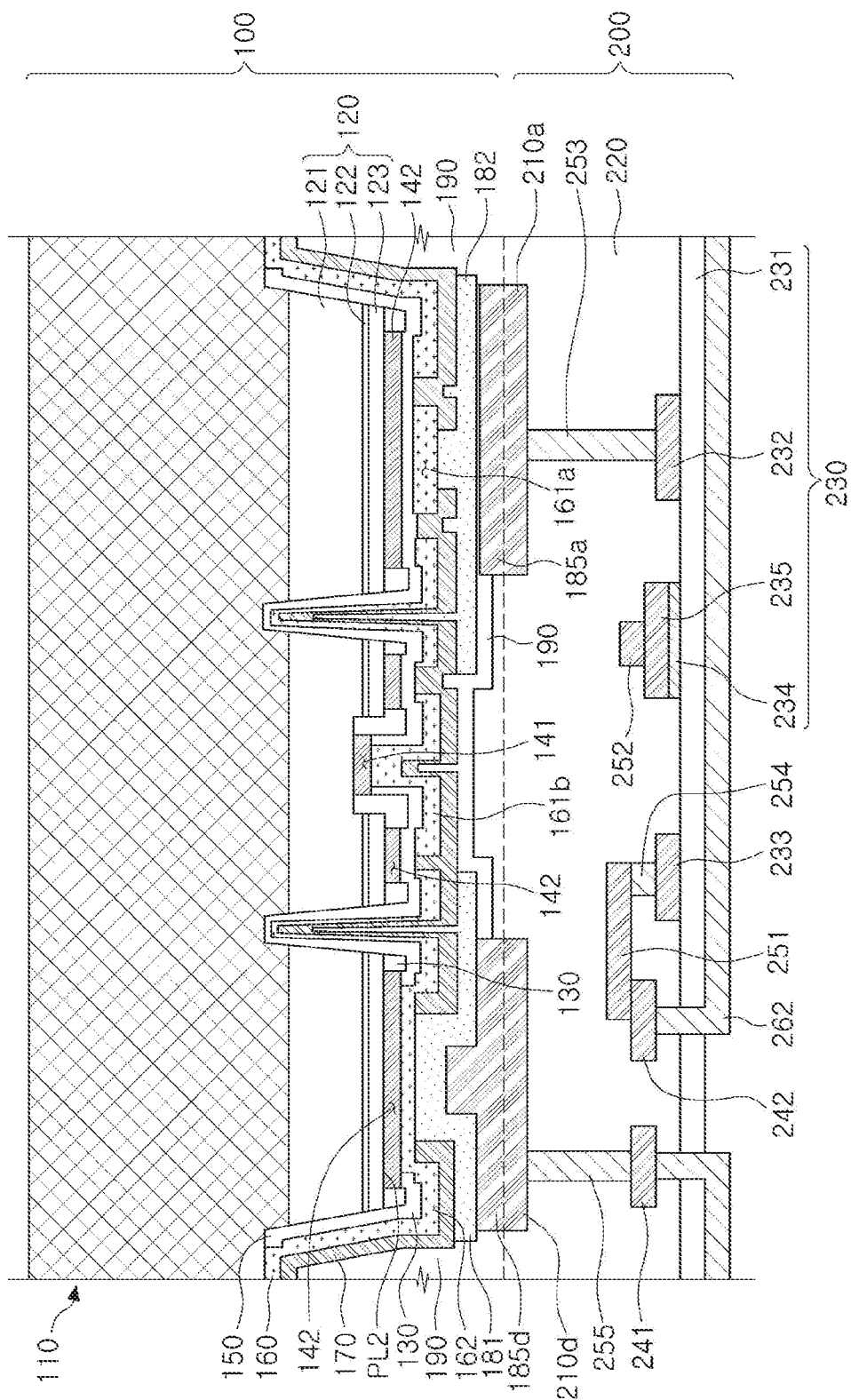

Next, referring to FIG. 12, after the second substrate 270 (see FIG. 11) is separated to expose the semiconductor layer 231, the wiring circuits 241 and 242 may be formed to penetrate through the semiconductor layer 231. In addition, the vias 253, 254 and 255 may be formed to penetrate through the second bonding layer 220 in a direction perpendicular to the second substrate structure 200. According to an example embodiment, an operation of thinning the exposed semiconductor layer 231 may further be performed. In addition, an adhesive layer may be formed on the exposed semiconductor layer 231, and a temporary substrate may be attached thereto, to support the first substrate structure 100 and the second substrate structure 200.

Figure 13:
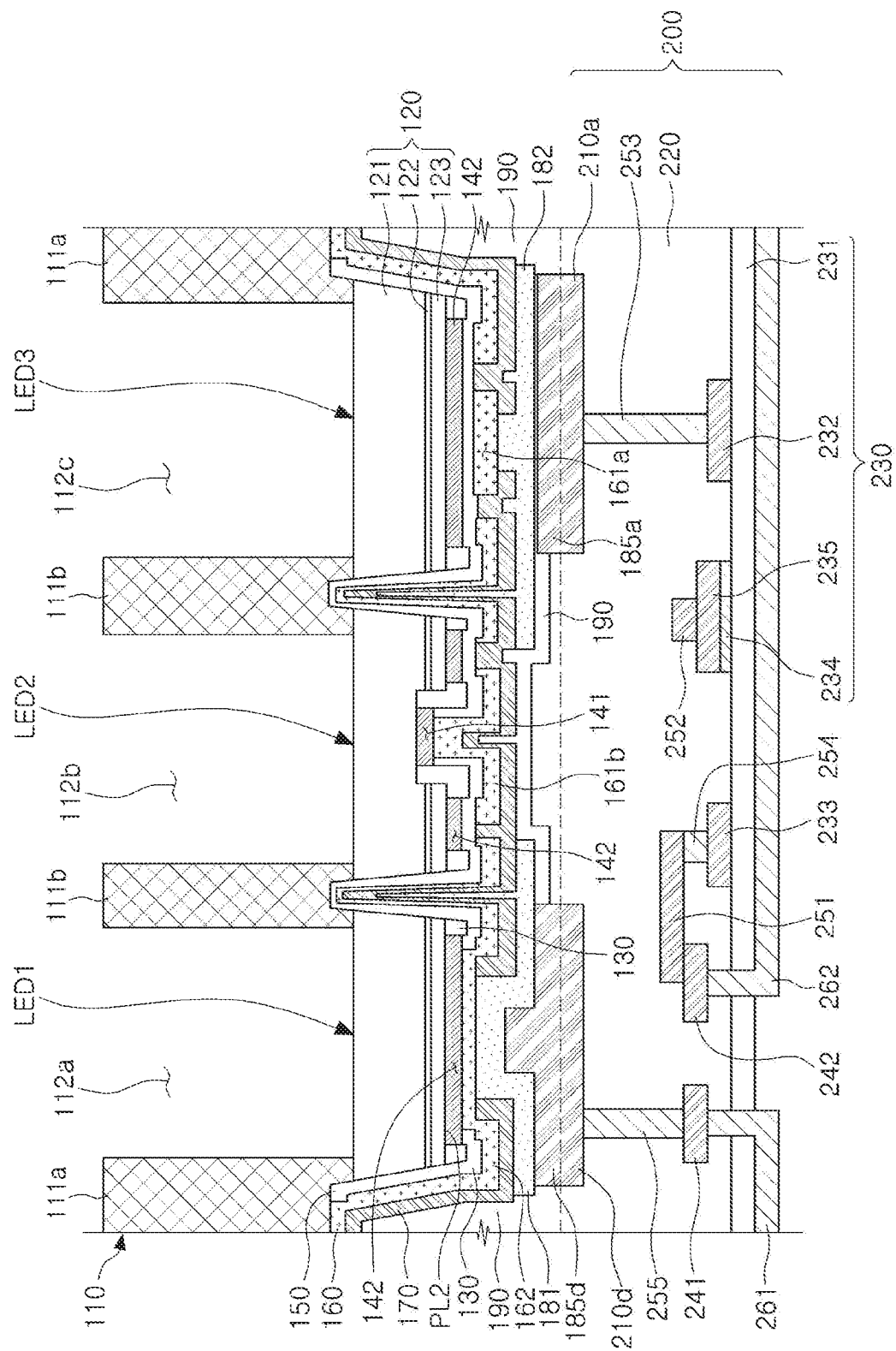

Then, referring to FIG. 13, first to third light-emitting windows 112a, 112b and 112c may be formed by etching portions of the growth substrate 110, corresponding to the first to third LED cells LED1, LED2 and LED3. According to an example embodiment, the growth substrate 110 may be ground to be thinned before forming the first to third light-emitting windows 112a, 112b and 112c.

Figure 14:
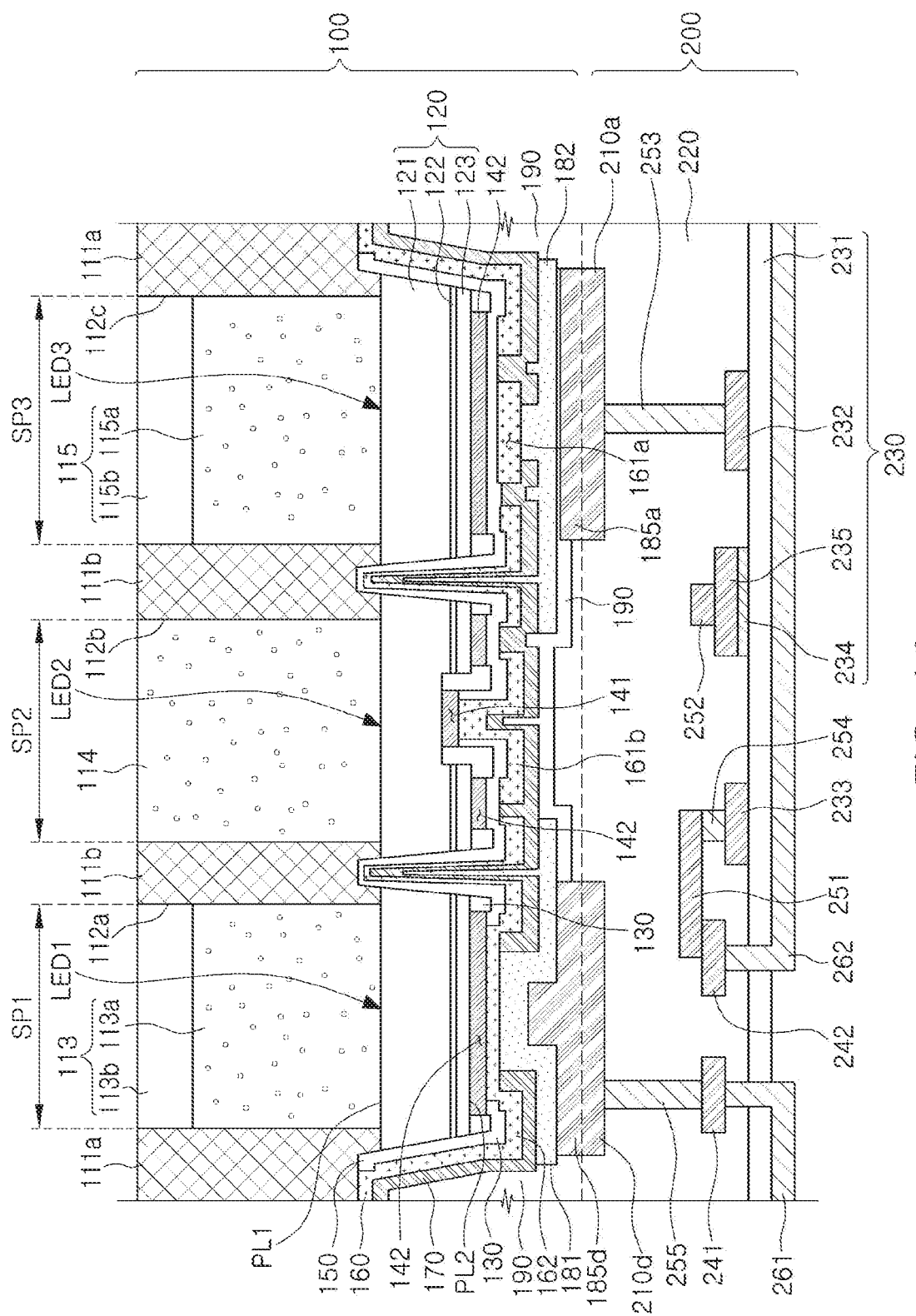
Figure 15:
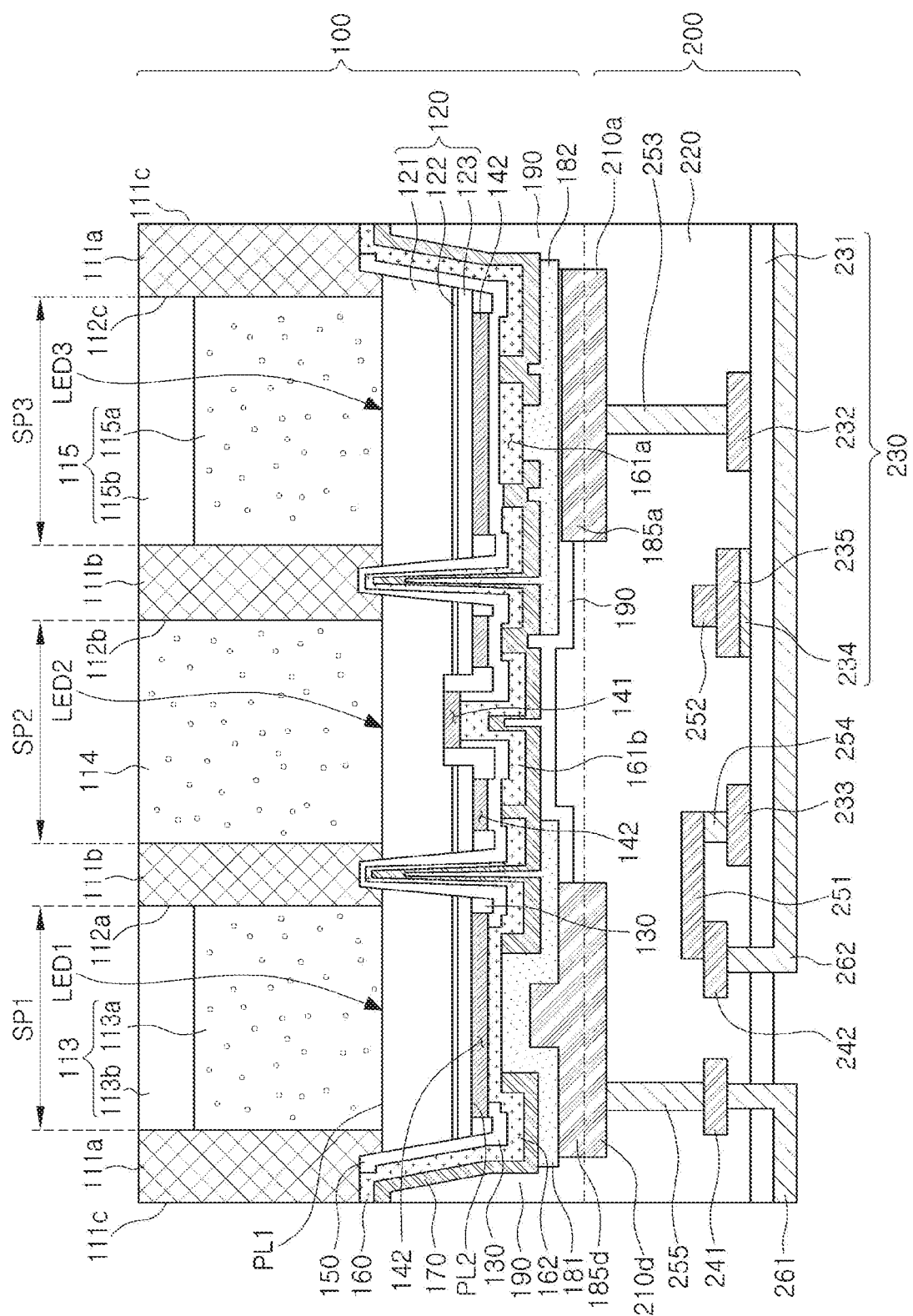

Next, referring to FIG. 14, the first to third wavelength converters 113, 114 and 115 may be formed by respectively dispensing, a light transmissive liquid resin mixed with a wavelength converting material, into the first to third light-emitting windows 112a, 112b and 112c, and may be cut in the unit of modules including a plurality of pixels, using a blade, thereby manufacturing a display module illustrated in FIG. 15.

As described above, the first substrate structure 100, in which the LED cells are disposed, and the second substrate structure 200, in which the TFT cells 230 are disposed, are bonded to each other, and may then be cut into module units, thereby easily manufacturing a display module including a plurality of pixels at a wafer level. In addition, since a high-resolution display module having a plurality of pixels may be provided, the time required for transferring pixels in the process of manufacturing a display device may be significantly reduced.

As set forth above, according to an example embodiment, a method of manufacturing a high-resolution display module having a plurality of pixels without an individual transfer process at the unit of a pixel, by joining a substrate on which a TFT circuitry is formed and a substrate on which an LED array is formed to each other at a wafer level, may be provided.

While example embodiments have been shown and described above, it will be apparent to those skilled in the art that modifications and variations could be made without departing from the scope of the present inventive concept as defined by the appended claims.

What is claimed is:

1. A display module comprising:
   a first substrate structure comprising:
      a partition structure having a plurality of light-emitting windows, each of the plurality of light-emitting windows comprising a wavelength converter, wherein at least one of the plurality of light-emitting windows comprises an optical filter disposed on the wavelength converter;
      a light-emitting diode (LED) array including:
         a plurality of LED cells, each LED cell of the plurality of LED cells having a first conductivity-type semiconductor layer, an active layer and a second conductivity-type semiconductor layer,
         a first electrode pad and a second pad connected to the plurality of LED cells, the plurality of light-emitting windows being respectively disposed on the plurality of LED cells, and
         a first bonding layer covering the LED array
      wherein a bottom surface of the first electrode pad, a bottom surface of the second electrode pad and a bottom surface of the first bonding layer together form a first coplanar surface; and
   a second substrate structure comprising:
      a plurality of driving transistors disposed on the first substrate structure and configured to control the plurality of LED cells, each driving transistor of the plurality of driving transistors comprising:
         a channel semiconductor layer providing a channel region of the plurality of driving transistors;
         a source region;
         a drain region; and
         a gate electrode disposed between the source region and the drain region, wherein the second substrate structure is configured to form a circuit region, in which a first connection portion and a second connection portion, disposed to correspond to the first electrode pad and the second electrode pad respectively, are disposed one surface of the second substrate structure,
      a second bonding layer covering the circuit region, wherein a top surface of the first connection portion, a top surface of the second connection portion and a top surface of the second bonding layer together form a second coplanar surface bonded to the first coplanar surface of the first substrate structure, and
      a first electrode pattern and a second electrode pattern disposed on channel semiconductor layer, wherein the first electrode pattern is connected to the first connection portion, and the second electrode pattern is connected to the drain region.

2. The display module of claim 1, wherein the first electrode pattern and the second electrode pattern are connected through the channel semiconductor layer.

3. The display module of claim 1,
further comprising a first wiring circuit and a second wiring circuit disposed between the first connection portion and the second connection portion and the channel semiconductor layer,
wherein the first electrode pattern and the second electrode pattern are connected to the first wiring circuit and the second wiring circuit, respectively.

4. The display module of claim 1, wherein the first coplanar surface and the second coplanar surface are fusion bonded.

5. The display module of claim 1, wherein the first bonding layer and the second bonding layer are formed of a material including silicon.

6. The display module of claim 5, wherein the material comprises at least one of SiO, SiN, SiCN, SiOC, SiON, and SiOCN.

7. The display module of claim 1,
wherein the first electrode pad, the second electrode pad, the first connection portion, and the second connection portion are formed of the same material.

8. The display module of claim 1, wherein the first electrode pad, the second electrode pad and the first connection portion and the second connection portion are formed to have a substantially identical cross-sectional area in a plan view, respectively.

9. The display module of claim 1, further comprising a plurality of wavelength converts comprising:
a first wavelength converter;
a second wavelength converter; and
a third wavelength converter; and
wherein the first wavelength converter and the third wavelength converter comprise red phosphor and green phosphor, respectively.

10. The display module of claim 1, wherein the plurality of light-emitting windows are formed to have a substantially identical cross-sectional area in a plan view.

11. The display module of claim 1, wherein the plurality of light-emitting windows comprise:
a first window;
a second window; and
a third window, and
wherein the first, second, and third windows are arranged to one another.

12. The display module of claim 1, wherein the first substrate structure includes pixels, each pixel of the pixels having a plurality of subpixels.

13. The display module of claim 12, wherein the plurality of subpixels comprise:
a first subpixel configured to emit red light;
a second subpixel configured to emit blue light; and
a third subpixel confgured to emit green light.

14. The display module of claim 13,
wherein the pixels are arranged in a matrix.

15. A display module comprising:
a partition structure having a plurality of light-emitting windows, each of the plurality of light-emitting windows comprising a wavelength converter, wherein at least one of the plurality of light-emitting windows comprises an optical filter disposed on the wavelength converter;
a light-emitting diode (LED) array including:
a plurality of LED cells, each LED cell of the plurality of LED cells having a first conductivity-type semiconductor layer, an active layer and a second conductivity-type semiconductor layer;
a first electrode pad and a second electrode pad connected to the plurality of LED cells and the plurality of light-emitting windows being respectively disposed on the plurality of LED cells;
a first bonding layer covering the LED array and forming a first coplanar surface with the first electrode pad and the second electrode pad;
a second bonding layer having a second coplanar surface bonded to the first coplanar surface;
a plurality of driving transistors disposed in the second bonding layer and configured to control the plurality of LED cells, respectively, the plurality of driving transistors including a first connection portion and a second connection portion connected to the first electrode pad and the second electrode pad through the second bonding layer, respectively; and
a semiconductor layer disposed on the second bonding layer, providing a channel region of the plurality of driving transistors.

16. The display module of claim 15, wherein the plurality of LED cells emit light of substantially the same wavelength.

17. The display module of claim 15, wherein the first connection portion and the second connection portion are arranged in a matrix form on the second bonding layer.

18. The display module of claim 15, wherein the partition structure is fomed of silicon (Si) material.

19. The display module of claim 15, wherein each of the plurality of LED cells includes a size of 10 μm or less.

20. The display module of claim 15, wherein the first electrode pad and the second electrode pad and the first connection portion and the second connection portion are formed to have a substantially identical area in a plan view, respectively.

* * * * *